United States Patent [19]

Anand et al.

[11] Patent Number: 4,559,696
[45] Date of Patent: Dec. 24, 1985

[54] ION IMPLANTATION TO INCREASE EMITTER ENERGY GAP IN BIPOLAR TRANSISTORS

[75] Inventors: Kranti Anand, Sunnyvale; Robert J. Strain, San Jose, both of Calif.

[73] Assignee: Fairchild Camera & Instrument Corporation, Mountain View, Calif.

[21] Appl. No.: 629,576

[22] Filed: Jul. 11, 1984

[51] Int. Cl.⁴ .................. H01L 21/265; H01L 29/161; H01L 21/72
[52] U.S. Cl. .................... 29/576 B; 148/1.5; 148/175; 148/187; 357/34; 357/63; 357/91
[58] Field of Search ................. 148/1.5, 187, 175; 29/576 B; 357/34, 91, 63

[56] References Cited

U.S. PATENT DOCUMENTS 2,569,347  9/1951  Shockley ............................ 332/52
4,178,190 12/1979  Polinsky ............................ 148/1.5
4,302,763 11/1981  Ohuchi et al. ...................... 357/34

OTHER PUBLICATIONS

Kroemer, Herbert, "Heterostructure Bipolar Transistors and Integrated Circuits", *Proceedings of the IEEE*, vol. 70, No. 1, Jan. 1982, pp. 13–25.
Stephen et al. in Ion Implantation in Semiconductors, ed. S. Namba, Plenum, N.Y., 1975, p. 619.
Lee et al. in Ion-Implantation in Semiconductors, ed. S. Namba, Plenum, N.Y., 1975, p. 519.

*Primary Examiner*—Upendra Roy
*Attorney, Agent, or Firm*—Burns, Doane, Swecker & Mathis

[57] ABSTRACT

The suppression of the reverse injection of the carriers in a bipolar transistor, without adversely effecting forward injection, is carried out by modifying the energy gap characteristics of the transistor so that a greater barrier to reverse injection is presented than that which is confronted by the forward injected carriers. The energy gap of the emitter is increased, relative to that of the base, through ion implantation. The ions which are implanted are such that the resulting compound material has a higher energy gap than that of silicon into which they are implanted to selectively modify the emitter region so as to locally increase its energy gap. Preferred materials include carbon and nitrogen.

10 Claims, 6 Drawing Figures

ION IMPLANTATION TO INCREASE EMITTER ENERGY GAP IN BIPOLAR TRANSISTORS

BACKGROUND OF THE INVENTION

The present invention is directed to the fabrication of bipolar transistors for integrated circuits, and particularly directed to the improvement of the emitter efficiency of a bipolar transistor.

In a forward biased bipolar transistor the flow of current from the emitter to the base comprises two components. For example, in an N-P-N transistor, the emitter current consists of forward injected electrons crossing from the emitter into the base, and reverse injected holes crossing from the base into the emitter. It is generally desirable to limit the reverse injection current in a transistor, since the current which results from the holes crossing the emitter junction from base to emitter (in an N-P-N transistor) does not contribute carriers which can eventually reach the collector of the transistor.

In the past, the suppression of the reverse injected carriers has been accomplished by doping the emitter much more heavily than the base region of the transistor. Such a feature insures that the emitter current will consist almost entirely of forward injected carriers. However, such an approach places a limitation on the doping of the base region, and hence limits the frequency response of the transistor.

Another approach to the suppression of reverse injection utilizes variations in the energy gap between the emitter and the base to present a greater barrier to reverse injection than to forward injection. In fact, Shockley generally alluded to such an approach in his basic patent on the transistor, U.S. Pat. No. 2,569,347. However, due to technological limitations, such an approach has not heretofore been employed in any practical, i.e., commercial applications.

Recently, two epitaxial processes, namely molecular beam epitaxy and metal-organic chemical vapor deposition, have been proposed as viable techniques for producing an emitter with a wider energy gap than a base. See the article by Herbert Kroemer entitled "Heterostructure Bipolar Transistors and Integrated Circuits" appearing in *Proc. IEEE*, Vol. 70, No. 1, January 1982 at pages 13-25. It has yet to be determined whether the proposed techniques are capable of practical applications. For example, when silicon is the material in which the transistor is formed, it is very difficult to grow a thin layer (on the order of 0.1-0.2 microns) of material having a different energy gap and yet maintain the integrity of that layer. In addition, molecular beam epitaxy is a relatively slow, and hence expensive, process. In any event, it appears that the proposed epitaxial techniques are limited to the use of III/V compound semiconductors to form heterostructures.

OBJECTS AND BRIEF STATEMENT OF THE INVENTION

It is accordingly an object of the present invention to limit the reverse injection of carriers in a bipolar transistor by a method which does not limit the concentration of dopant atoms in the base region of the transistor.

It is another object of the present invention to provide a bipolar transistor having improved emitter efficiency and frequency response than conventionally formed transistors.

It is a further object of the invention to provide a bipolar transistor with a wide energy gap emitter by means which are technologically simpler to implement than the heretofore proposed epitaxial techniques.

In accordance with the present invention, the suppression of the reverse injection of the carriers, without adversely effecting forward injection, is carried out by modifying the energy gap characteristics of the transistors so that a greater barrier to reverse injection is presented than that which is confronted by the forward injected carriers. More particularly, in accordance with the present invention, the energy gap of the emitter is increased, relative to that of the base, so that a greater amount of energy is required for reverse injection than for forward injection.

This increase of the emitter energy gap is accomplished through ion implantation, to selectively modify the emitter material so as to locally increase its energy gap. The ions which are implanted are of a material which has a higher energy gap than that of the substrate material, e.g., silicon, into which they are implanted. Preferred materials include carbon and nitrogen.

Further features and advantages of the present invention are explained in detail in the following description of preferred embodiments of the invention, with reference to the accompanying drawings.

DESCRIPTION OF THE ILLUSTRATED EMBODIMENT

In the following description of a preferred embodiment of the invention, particular reference is made to the use of the invention in connection with the fabrication of NPN bipolar transistors, in order to facilitate an understanding of the invention. However, it will be appreciated by those having familiarity with integrated circuit technology that the applications of the inventions are not so limited and that it can be used with success in other types of transistors, e.g. PNP bipolar transistors.

Figure 1A:
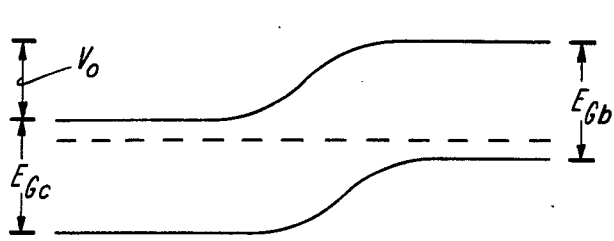
FIGS. 1A and 1B are energy band diagrams of a nongraded p-n junction in an unbiased and a forwardly biased state, respectively.

The principles underlying the present invention are explained with reference to FIGS. 1 and 2. Referring first to FIG. 1A, the energy band diagram for the emitter/base junction of a conventional transistor is illustrated for the case in which the junction is unbiased. By conventional transistor is meant a transistor in which the energy gap $E_{Ge}$ for the n-type material comprising the emitter is approximately the same as the energy gap $E_{Gb}$ for the p-type material in the base region of the transistor. For example, if each of these two regions are formed by appropriately doped silicon, the energy gap of each would be approximately 1.1 electron volts.

When the junction is in equilibrium, i.e., no electrical bias is applied to it, a junction barrier potential $V_o$ is inherently formed. This potential is equal to the difference between the conduction band energy levels for the n and p-type materials, and presents a barrier to the flow of electrons from the n-type material (emitter) into the p-type material (base). A similar such barrier is presented for the flow of holes from the base into the emitter by virtue of the difference between the valence band energy levels for the two regions.

Figure 1B:
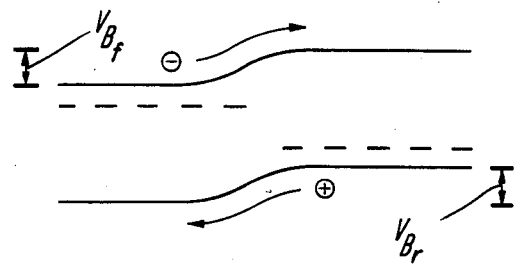

FIG. 1B illustrates the situation in which the emitter/base junction is forwardly biased. The effect of forward biasing is to reduce the magnitude of the junction barrier potential and thereby "flatten" the curve between the energy levels for the emitter and the base. The barrier potential $V_{Bf}$ for forward injection of electrons from the emitter into the base is equal to the junction potential $V_o$ diminished by the magnitude of the forward biasing voltage. This reduced barrier enables the electrons to more easily flow from the emitter into the base.

Similarly, the barrier potential $V_{Br}$ for the flow of holes from the base into the emitter is reduced, thus enabling reverse injection to take place. However, this reverse injection is undesirable since it does not contribute any carriers that can subsequently reach the collector of the transistor.

Figure 2A:
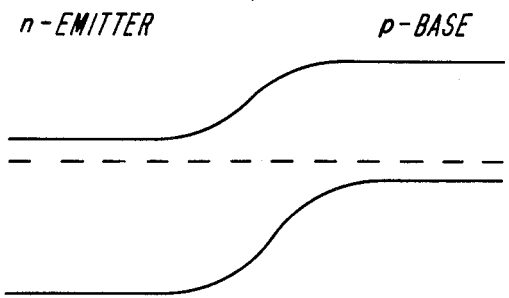
FIGS. 2A and 2B are energy band diagrams of an nonbiased and forwardly biased p-n junction that is graded in accordance with the present invention.
Figure 2B:
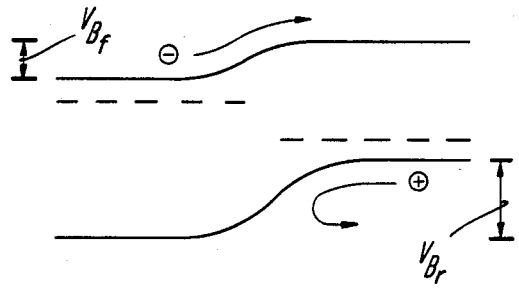

In accordance with the present invention, the reverse injection is inhibited by increasing the barrier potential $V_{Br}$ for the flow of holes from base to emitter, relative to the barrier potential $V_{Bf}$ for the flow of electrons from emitter to base. This increase is accomplished by grading the transistor regions so that the material comprising the n-type emitter has a greater energy gap $E_{Ge}$ than the energy gap $E_{Gb}$ for the material in the base region. The effect of such grading is illustrated in FIGS. 2A and 2B.

More particularly, the barrier potential $V_{Bf}$ for the flow of electrons from emitter to base is less than the barrier $V_{Br}$ for the flow of holes from base to emitter. When a forward bias is applied, as illustrated with respect to FIG. 2B, the small forward barrier potential $V_{Bf}$ will enable electrons to flow from the emitter to the base. However, for the flow of holes from base to emitter, even with the application of the forward voltage there remains a greater barrier against the flow of holes than against the flow of electrons. Consequently, the injection of holes from base to emitter will be inhibited relative to the injection of electrons from emitter to base, thus resulting in a more efficient operation of the transistor using this means of band-gap modification than is obtained in a conventionally formed transistor.

The particular manner in which the transistor is graded in accordance with the present invention is through ion implantation of a material having an energy gap which is greater than the energy gap of the substrate material in which the transistor is formed. For example, transistors and other integrated circuit devices are typically formed on silicon substrates. In accordance with the present invention, ions of a material such as carbon or nitrogen are implanted into a region of the silicon substrate to produce a composite material having a higher energy gap than that of silicon.

Figure 3:
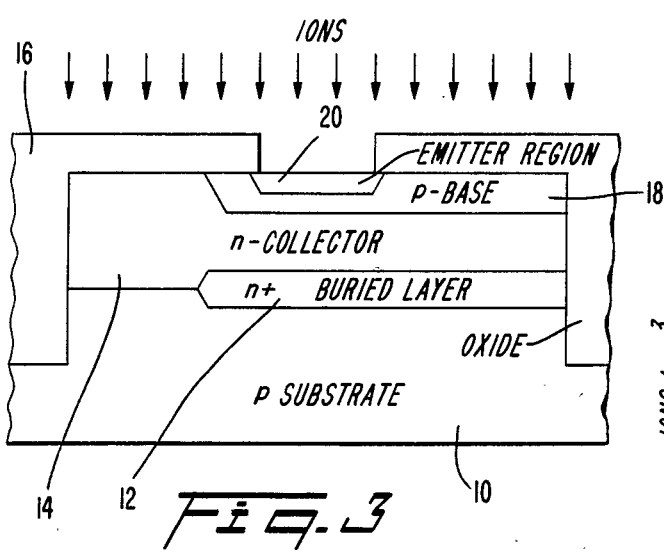
FIG. 3 is a cross-sectional illustration of a monolithic integrated bipolar transistor, illustrating the step of ion implantation during the fabrication thereof.

Referring to FIG. 3, a transistor is typically formed on a silicon substrate 10 that has been doped with a suitable group III material, such as boron or aluminum, to form an acceptor, or p-type, material. Ions of a donor impurity, such as arsenic or antimony, are implanted into a region of this substrate to form an n+ buried layer 12, and than a further layer of n-type material is grown on the substrate to form a layer 14 which will eventually become the collector of transistor. At this point, the substrate is generally divided into recessed field regions and raised islands on which the active devices, e.g., transistors, are formed. The field regions are filled with an oxide material 16 to isolate the various islands from one another. Then, the portion of the oxide covering the active islands is removed and ions of a p-type material are injected into the exposed silicon to form the base region 18 of the transistor. The active area is then suitably masked, for example with an oxide layer, and ions of an n-type material are injected into a portion of the base region to form the emitter region 20 for the transistor. Finally, suitable holes are provided in the oxide layer 16 to enable contact to be made with the base and collector regions of the transistor, as well as the exposed emitter region.

In accordance with the present invention, the grading of the emitter region relative to the base region is carried out by implanting ions of a material such as carbon or nitrogen into the emitter region so as to increase its energy gap. The implanting of these ions can be carried out subsequent to the implanting of the ions of arsenic or other n-type material. However, if two different ion sources can be arranged to shoot along the same flight path, the doping and grading ions can be implanted simultaneously. It will be appreciated that the implantation does not require any additional masking steps, and thus does not complicate the fabrication process.

The concentration of the grading ions that are to be implanted into the emitter region is dependent upon the degree to which it is desired to increase the reverse barrier potential $V_{Br}$. The flow of holes under reverse injection will be reduced by an order of magnitude for each increase of about 60 meV in the barrier potential. A total band gap change of about 120 meV, to reduce reverse injection by 100 fold, will probably be practical in most cases.

The dose of ions to be implanted to achieve such a band gap increase is determined by the difference between the energy gap of the semiconductor material and that of the grading material. The percentage of the grading material that is required in the emitter region to achieve the desired increase in the band gap is based upon an interpolation between the energy gaps of the semiconductor and grading materials, with reference to the desired energy gap. For example, to increase the energy gap of a silicon based transistor (which has an energy gap of 1.15 eV) using ions of carbon (which has an energy gap of 5.4 eV) by 120 meV, the percentage x of carbon atoms that are required in the emitter region is calculated as follows:

$$1.15(1-x)+5.4(x)=1.15+0.120$$

Figure 4:
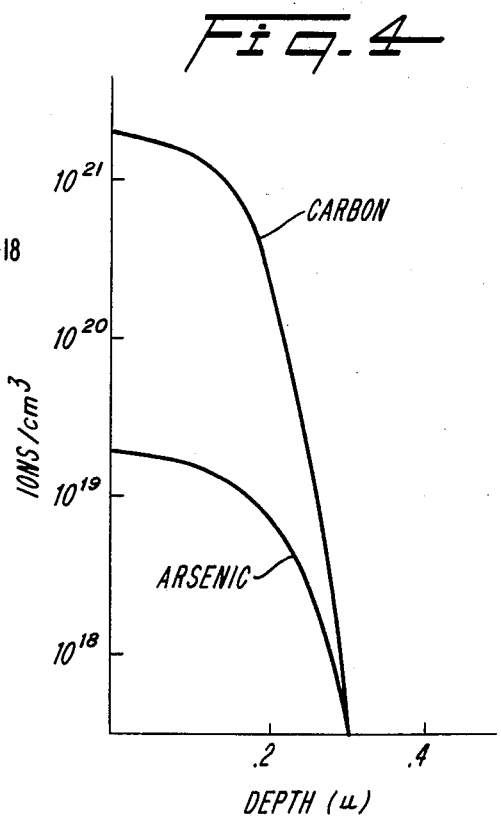
FIG. 4 is a graph illustrating the relative densities of the doping and grading materials in the emitter of the transistor.

Solving this equation reveals that a 120 meV increase of the band gap requires about 3% carbon. A comparison of the arsenic and carbon atom concentration profile that might be typically present in a graded emitter is illustrated in FIG. 4. This could be achieved by a continuously variable and programmed beam energy and beam current combination during the implant process to give this composite profile.

While carbon has been indicated to be one atom that is suitable for grading the emitter, other materials may provide similar functions. For example, since silicon nitride has a higher band gap (5.1 eV) than pure silicon, implantation of nitrogen ions into the emitter region should provide a similar result. Basically, the criteria that are used to select a suitable grading material relate to the material's energy gap and the size of its ions. As discussed previously, the energy gap of the material should be higher than that of the semiconductor into which it is being implanted, so as to achieve the desired increase in the overall energy gap in the emitter. Furthermore, the material should distribute itself uniformly in the silicon and not agglomerate, so as not to introduce recombination centers in sufficient numbers. Accordingly, the material that is chosen for the grading function should have a size that is compatible with the silicon lattice, so as to achieve as little lattice mismatch as possible. For this reason, carbon and nitrogen appear to be the two most likely choices.

One of the significant advantages of a transistor with a wide energy gap emitter, as provided by the present invention, lies in its improved efficiency relative to a conventional transistor in which the emitter and base have approximately the same energy gap. More particularly, a transistor constructed in accordance with the present invention will have a higher gain than a conventional transistor with the same geometry, e.g., surface area on a chip. Or, if the circuit designer desires, the frequency response of the device can be increased by adding more dopant to the base region.

The applications of the present invention are not limited to transistors having a structure of the type illustrated in FIG. 3. For example, grading ions can be implanted into the uniform n-substrate that forms the common emitter and base of the switching and injection transistors, respectively, in integrated injection logic to achieve a wider energy gap and thereby attain its resultant advantages.

Accordingly, it will be appreciated by those of ordinary skill in the art that the present invention can be embodied in other specific forms without departing from the spirit or essential characteristics thereof. The presently disclosed embodiment is therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A method of improving the emitter efficiency of a bipolar transistor, comprising the steps of:
   doping a silicon substrate with an impurity of one conductivity to form a base region for a transistor;
   implanting an impurity of opposite conductivity in a portion of said base region to form an emitter region; and
   implanting ions of a material having an energy gap which is greater than the energy gap of silicon in said emitter region, thereby to provide the emitter region with an energy gap which is greater than that of the base region.

2. The method of claim 1 wherein said material is carbon.

3. The method of claim 1 wherein said material is nitrogen.

4. The method of claim 1 wherein said two implanting steps are carried out simultaneously.

5. The method of claim 1 wherein said implanting steps are carried out in succession.

6. In a bipolar transistor having an emitter region of one conductivity located adjacent a base region of opposite conductivity, a method for providing reduced conduction by injection of carriers from the base region to the emitter region, relative to the injection of carriers from the emitter region to the base region, comprising the step of implanting the emitter region with ions of a material having an energy gap which is greater than the energy gap of the substrate in which the transistor is formed, thereby to increase the energy gap of the emitter region relative to that of the base region.

7. The process of claim 6 wherein the transistor is formed on a silicon substrate and said material has an energy gap that is greater than 1.1 eV.

8. The process of claim 6 wherein said transistor is embodied in integrated injection logic, and the emitter region with the increased energy gap comprises the uniform n-substrate common to the switching and injection transistors of the logic.

9. The process of claim 7 wherein said material is carbon.

10. The process of claim 7 wherein said material is nitrogen.

* * * * *